(12) United States Patent
Guo et al.

(10) Patent No.: US 7,733,144 B2
(45) Date of Patent: Jun. 8, 2010

(54) RADIATION HARDENED CMOS MASTER LATCH WITH REDUNDANT CLOCK INPUT CIRCUITS AND DESIGN STRUCTURE THEREFOR

(75) Inventors: Xi Guo, San Mateo, CA (US); Jerry P. Liu, San Jose, CA (US); Jianguo Yao, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/128,761

(22) Filed: May 29, 2008

(65) Prior Publication Data

US 2009/0295448 A1  Dec. 3, 2009

(51) Int. Cl.
*H03K 3/289* (2006.01)
(52) U.S. Cl. .................. 327/203; 327/202; 327/211
(58) Field of Classification Search .............. 327/199, 327/201, 202–204, 207–212, 214–219
See application file for complete search history.

(56) References Cited

U.S. PATENT DOCUMENTS

| 6,326,809 B1* | 12/2001 | Gambles et al. .......... 326/46 |
| 6,327,176 B1* | 12/2001 | Li et al. .......... 365/156 |
| 6,696,873 B2* | 2/2004 | Hazucha et al. .......... 327/203 |
| 7,212,056 B1* | 5/2007 | Belov .......... 327/210 |
| 7,362,154 B2 | 4/2008 | Mo |
| 7,576,583 B2* | 8/2009 | Kuboyama et al. .......... 327/218 |

* cited by examiner

*Primary Examiner*—Hai L Nguyen
(74) *Attorney, Agent, or Firm*—Rabin & Berdo, PC; James R. Nock

(57) ABSTRACT

A radiation hardened master latch for use in a programmable phase frequency divider operating at GHz frequencies is implemented in deep submicron CMOS technology, and consists of two identical half circuits interconnected in a DICE-type configuration that makes the master latch immune to a single event upset (SEU) affecting at most one of its four data inputs. Each half circuit includes a clock input circuit with four sub-clock nodes each coupled by an inverter to a common clock input. The clock input circuit is configured to be redundant, such that the operation of the master latch half circuit is also immune to an SEU affecting at most one the inverters associated with the plurality of sub-clock nodes. The radiation hardened master latch resides in a design structure embodied in a machine readable medium storing information for designing, manufacturing and/or testing the master latch.

8 Claims, 8 Drawing Sheets

US 7,733,144 B2

RADIATION HARDENED CMOS MASTER LATCH WITH REDUNDANT CLOCK INPUT CIRCUITS AND DESIGN STRUCTURE THEREFOR

BACKGROUND OF THE INVENTION

1. Field of the Invention

The invention relates to a radiation hardened master latch having redundant clock input circuits, suitable for use in a radiation hardened programmable phase frequency divider designed for implementation in deep submicron CMOS technology. The invention also relates to a design structure embodied in a machine readable medium for designing, manufacturing and/or testing such a radiation hardened master latch.

2. Background Information

CMOS circuits used in space applications are subject to single event upsets (SEU's) as a result of exposure to radiation consisting of alpha particles or neutrons. The charge induced by a single SEU hit can be as high as 1 picoCoulomb (pC), and can have a 2 milliAmpere (mA) amplitude with a 1 nanosecond (ns) period. When a programmable phase frequency divider (PPFD) used in such a space application is running at a frequency lower than 200 Megahertz (MHz), an SEU hit with 1 pC charge may not always cause a soft error if the timing of the SEU does not fall within the window for the set and hold times of any of the flip flops in the PPFD. In such case, a dual interlocked cell (DICE) type flip flop design, such as the one described in Weizhong Wang and Haiyan Gong, "Sense Amplifier Based RADHARD Flip Flop Design," IEEE Transactions on Nuclear Science, Vol. 51, No. 6 (December 2004), may be used. However, a PPFD fabricated in deep submicron technology can run at frequencies in the Gigahertz (GHZ) range. In this case, the vulnerable timing window for set and hold of the PPFD's D-type flip flops (DFF's) will always be covered by the typical 1 ns period of an SEU hit.

A radiation hardening technique to ensure that the PPFD continues to function properly in a radiation environment is disclosed in U.S. patent application Ser. No. 11/419,008, by William Mo, filed on May 16, 2006 and assigned to IBM Corporation ("Mo '008"). The Mo '008 application, which is incorporated herein by reference, is directed to a PPFD for space applications that is implemented in CMOS technology, consisting in the exemplary embodiment of three radiation hardened D-type flip flops and combinational logic circuits to provide the feedback controls that allow programmable frequency division according to an integer division number, between 1 and 8, that is input to the combinational logic circuits. The radiation hardened D-type flip flop circuits are designed to keep on running properly at GHz frequencies even after a single event upset (SEU) hit. The novel D-type flip flop circuits each have two pairs of complementary inputs and outputs to mitigate SEU's. The combinational logic circuits are designed to utilize the complementary outputs in such a way that only one of the four dual complementary inputs to any D-type flip flop gets flipped at most after an SEU hit. The PPFD outputs a pulse train representing the clock source frequency divided in accordance with the division number.

As disclosed in further detail in the Mo '008 application, each of the radiation hardened D-type flip flops in the exemplary embodiment includes a master latch having a clock input, first and second data and complementary data inputs, and first and second data and complementary data outputs, which is connected in tandem to a slave latch having first and second data and complementary data inputs, and first and second data and complementary data outputs. Operation of the D-type flip flop is immune to a single event upset affecting at most one of the four data inputs to the master latch or to the slave latch.

The Mo '008 application further discloses that the radiation hardened master latch 20 of the exemplary embodiment, shown in FIG. 1 hereof, includes: a first master latch half circuit 10 having a clock input CLK, first and second data and complementary data inputs DIN_0, DIN_1, DINB_0 and DINB_1, feedback and complementary feedback inputs Q_DUAL and QB_DUAL, and data and complementary data outputs Q and QB; and a second master latch half circuit 10 identical to the first master latch half circuit and having a corresponding clock input, first and second data and complementary data inputs, feedback and complementary feedback inputs and data and complementary data outputs. In the master latch, the respective clock inputs of the first and second master latch half circuits are connected together in parallel; the respective first and second data and complementary data inputs of the first and second master latch half circuits are connected together in parallel; the data and complementary data outputs of the first master latch half circuit are cross connected to the feedback and complementary feedback inputs of the second master latch half circuit; and the data and complementary data outputs of the second master latch half circuit are cross connected to the feedback and complementary feedback inputs of the first master latch half circuit. In the absence of SEU's, the first and second pairs of data inputs to the master latch have nominally the same input voltage levels. Operation of the master latch is immune to a single event upset affecting at most one of the four data inputs to the master latch.

FIG. 2 hereof is a schematic diagram of each one of the two identical master latch half circuits 10 of the exemplary embodiment disclosed in the Mo '008 application. While each exemplary master latch half circuit effectively utilizes pairs of data and complementary data inputs and outputs to mitigate the effect of SEU's, it can be seen from FIG. 2 that there is no similar protection for the clock node CLK. At the clock node CLK in FIG. 2, there is a single inverter 12, the output of which is connected to the gates of transistors T10, T11 and T12. The inverter 12 would typically be implemented using the semiconductor circuit shown schematically in FIG. 3. If the n+ drain diffusion 31 of the NFET device 32 of the inverter 12 were to be hit, even with a low energy radiation particle, it would cause the master latch to lose state during the evaluate phase, when the inverter 12 output, CKB_TOP is being held to a logical 1, and the master latch would function incorrectly. Under these circumstances, what is required is an improved clock input circuit that is designed to ensure that the exemplary master latch of the Mo '008 application continues to function properly in a radiation environment.

SUMMARY OF THE INVENTION

It is, therefore, a principle object of this invention to provide a radiation hardened master latch suitable for use in a radiation hardened programmable phase frequency divider designed for implementation in deep submicron CMOS technology.

It is another object of the invention to provide a radiation hardened master latch with a redundant clock input circuit that solves the above mentioned problems.

It is a further object of the invention to provide a design structure embodied in a machine readable medium in which information relating to the design, manufacture and/or testing of the radiation hardened master latch with redundant clock input circuits resides.

These and other objects of the present invention are accomplished by the CMOS radiation hardened master latch with redundant clock input circuits that is disclosed herein.

In a first aspect of the invention, the inventive radiation hardened master latch includes a first master latch half circuit, and a second master latch half circuit that is identical to and interconnected with first master latch half circuit. Each of the identical master latch half circuits has a clock input and includes a clock input circuit in which the clock input in coupled to a plurality of sub-clock nodes. The preferred embodiment has four such sub-clock nodes each individually coupled to the clock input through an inverter. The clock input circuit is configured to be redundant, such that the operation of the master latch half circuit is immune to a single upset event affecting at most one the inverters associated with the plurality of sub-clock nodes.

In another aspect of the invention, each of the master latch half circuits has, in addition to the clock input, first and second data inputs, first and second complementary data inputs, a feedback input, a complementary feedback input, a data output and a complementary data output. In the master latch, the respective clock inputs of the first and second master latch half circuits are connected together in parallel; the respective first and second data inputs and complementary data inputs of the first and second master latch half circuits are connected together in parallel; the data output and the complementary data output of the first master latch half circuit are cross connected respectively to the feedback input and complementary feedback input of the second master latch half circuit; and the data output and complementary data output of the second master latch half circuit are cross connected respectively to the feedback input and complementary feedback input of the first master latch half circuit. In the absence of SEU's, the first and second pairs of data inputs to the master latch have nominally the same input voltage levels. Because of its unique configuration, the operation of the master latch is immune to a single event upset affecting at most one of the four data inputs. The master latch is preferably implemented in deep submicron CMOS technology capable of operating at GHz frequencies.

In a further aspect of the invention, the radiation hardened master latch resides in a design structure embodied in a machine readable medium storing information for designing, manufacturing and/or testing the radiation hardened master latch. The design structure may comprise a netlist which describes the radiation hardened master latch. The design structure may also reside on the machine readable medium as a data format used for the exchange of layout data for integrated circuits. Further, the design structure may include test data files, characterization data, verification data and/or design specifications.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed to a radiation hardened master latch having redundant clock input circuits, suitable for use in a radiation hardened programmable phase frequency divider (PPFD) designed for implementation in deep submicron CMOS technology. The redundant clock input circuits improve the immunity to SEU's of the RADHARD master latch previously disclosed in U.S. patent application Ser. No. 11/419,008, by William Mo, filed on May 16, 2006 ("Mo '008"). A detailed description of the preferred embodiment follows.

Radhard Master Latch Design

Figure 4:
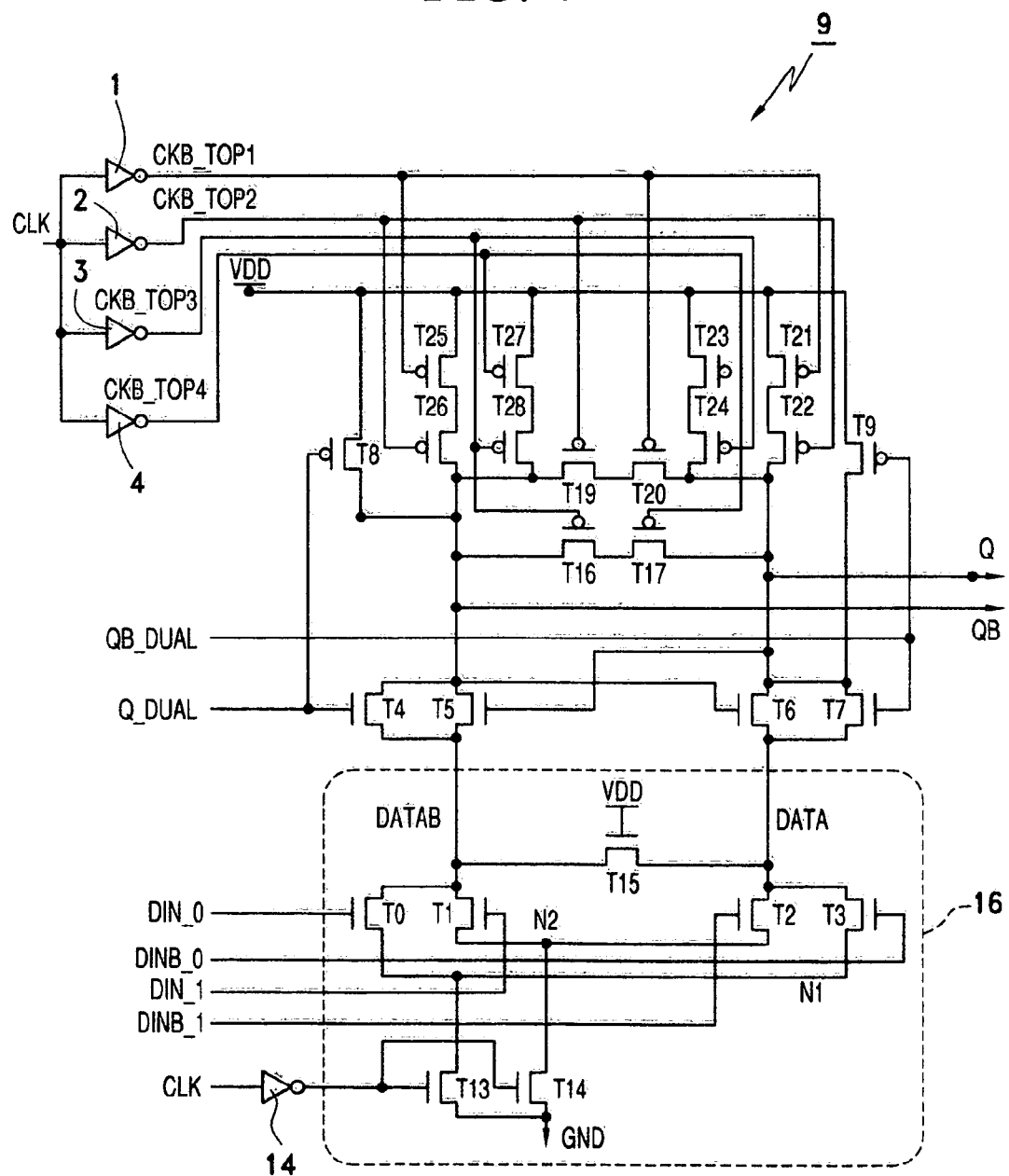
FIG. 4 is a schematic diagram of one of the identical half circuits of a radiation hardened master latch, according to the present invention.
Figure 5:
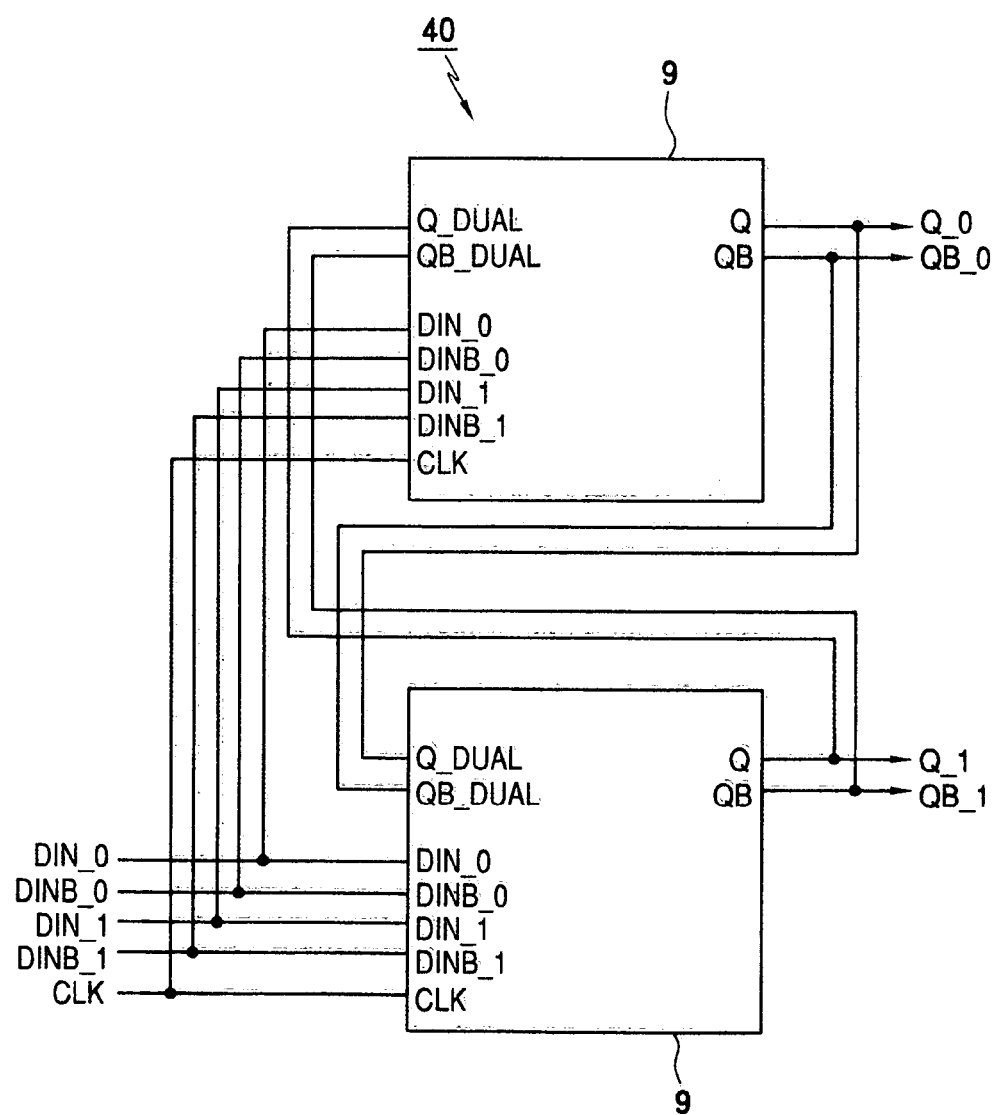
FIG. 5 is a block diagram of a radiation hardened master latch according to the present invention, employing two of the half circuits shown in FIG. 4.

As discussed above, FIG. 1 shows in block diagram form the radiation hardened master latch of Mo '008 that is based on a DICE-style connection of two identical master latch half circuits 10. FIG. 2 shows in schematic form the design of one of the master latch half circuits 10 according to Mo '008. FIG. 4 shows in schematic form the design of a master latch half circuit 9 according to the present invention. Semiconductor devices performing the same function and connected in the same manner in each version of the master latch half circuit bear the same designation. FIG. 5 shows in block diagram form a radiation hardened master latch 40 according to the present invention employing two of the master latch half circuits 9 shown in FIG. 4.

Like its counterpart in Mo '008, the master latch half circuit 9 of the present invention has dual complementary data inputs DIN_0, DINB_0 and DIN_1, DINB_1. Similarly, Q and QB are complementary data outputs. Q_DUAL and QB_DUAL are complementary feedback inputs from the other half circuit comprising the RADHARD master latch (see FIG. 1). CLK is the clock input. Voltage source VDD provides power to the circuit. In addition, the exemplary embodiment 9 of the master latch half circuit of the present invention has a RESET input.

In the preferred embodiment of the present invention, shown in FIG. 4, a redundant structure replaces the top clock input circuit of Mo '008, the latter consisting simply of inverter 12 and transistors T10, T11 and T12, shown in FIG. 2. In the circuit of FIG. 4, the common clock input CLK is connected to the inputs of inverters 1, 2, 3 and 4, which output, respectively, inverted clock signals CKB_TOP1, CKB_TOP2, CKB_TOP3 and CKB_TOP4. The redundant clock input circuit includes four series strings of transistors that are connected between the high potential VDD and the complementary outputs Q and QB, and are switched by the redundant inverter outputs. Specifically, transistor T21 has one drain-source region coupled to the high potential VDD and the other drain-source region coupled to one drain-source region of transistor T22. The other drain-source region of transistor T22 is coupled to output Q. The gate of transistor T21 is coupled to the output CKB_TOP1 of inverter 1, and the gate of transistor T22 is coupled to the output CKB_TOP2 of inverter 2.

Similarly, transistor T23 has one drain-source region coupled to the high potential VDD and the other drain-source region coupled to one drain-source region of transistor T24. The other drain-source region of transistor T24 is coupled to output Q. The gate of transistor T23 is coupled to the output CKB_TOP4 of inverter 4, and the gate of transistor T24 is coupled to the output CKB_TOP3 of inverter 3.

Transistor T25 has one drain-source region coupled to the high potential VDD and the other drain-source region coupled to one drain-source region of transistor T26. The other drain-source region of transistor T26 is coupled to complementary output QB. The gate of transistor T25 is coupled to the output CKB_TOP1 of inverter 1, and the gate of transistor T26 is coupled to the output CKB_TOP2 of inverter 2.

Similarly, transistor T27 has one drain-source region coupled to the high potential VDD and the other drain-source region coupled to one drain-source region of transistor T28. The other drain-source region of transistor T28 is coupled to complementary output QB. The gate of transistor T27 is coupled to the output CKB_TOP4 of inverter 4, and the gate of transistor T28 is coupled to the output CKB_TOP3 of inverter 3.

The top clock circuit also includes two series strings of equalization transistors connected in parallel between the outputs Q and QB. Specifically, transistor T19 has one drain-source region coupled to complementary output QB and the other drain-source region coupled to one drain-source region of transistor T20. The other drain-source region of transistor T20 is coupled to output Q. The gate of transistor T19 is coupled to the output CKB_TOP2 of inverter 2, and the gate of transistor T20 is coupled to the output CKB_TOP1 of inverter 1.

Similarly, transistor T16 has one drain-source region coupled to complementary output QB and the other drain-source region coupled to one drain-source region of transistor T17. The other drain-source region of transistor T17 is coupled to output Q. The gate of transistor T16 is coupled to the output CKB_TOP3 of inverter 3, and the gate of transistor T17 is coupled to the output CKB_TOP4 of inverter 4.

The above described redundant clock input circuit has been added to the original master latch half circuit disclosed in the Mo '008 application in order to prevent SEU's or SET's on the clock node from altering the state of the latch. The protection of the clock inverter is especially important during the evaluate phase. In the prior configuration shown in FIG. 2, inverter 12 is held to a logical 1 during the evaluate phase. However, if a radiation particle were to hit the n+ drain diffusion region of the NFET device in that inverter, it would temporarily cause the inverter to fall to logical 0 and it would turn on transistors T10, T11 and T12, causing both outputs Q and QB to pre-charge again and reach VDD.

In the present invention, the added redundant structure is composed of four inverters that are inverters 1, 2, 3 and 4, and 12 transistors that are transistors T16, T17, T19, T20, T21, T22, T23, T24, T25, T26, T27 and T28. With the redundant structure, the one clock node CKB_TOP shown in FIG. 2 becomes four sub-clock nodes CKB_TOP1, CKB_TOP2, CKB_TOP3 and CKB_TOP, shown in FIG. 4, which are the respective outputs of inverters 1, 2, 3 and 4. During the evaluate phase, the output of all inverters, 1 through 4, are held at a logical 1. However, if an SEU were to occur to the n+ drain diffusion in any one of the four inverters, the others will hold their state and not allow the outputs to master latch half circuit outputs Q, QB to be connected together and to VDD, and assure that the master latch will function correctly. Thus, with the configuration of pre-charging transistors (T21 through T28) and equalization transistors (T16, T17, T19 and T20) in the top clock input circuit of the present invention, the master latch does not experience functional failure even with a very high energy (several pC) SEU or SET radiation particle hitting the n+ drain diffusion region of the NFET device in one of the clock node inverters. Simulation results demonstrating the superior performance of the present invention in a radiation environment are discussed below.

The balance of the preferred master latch half circuit 9 of the present invention is the same as the master latch half circuit 10 disclosed in Mo '008. Transistors T4, T5, T6 and T7 form half of the master latch's interconnected flip flop circuits. Transistors T6 and T7 each have one drain-source region coupled to output Q and the other source-drain region coupled to a data node DATA. Transistors T4 and T5 each have one drain-source region coupled to complementary output QB and the other source-drain region coupled to a complementary data node DATAB. The gates of T5 and T6 are cross coupled to the outputs Q and QB, respectively. Transistor T8 has one drain-source region coupled to the high potential VDD and its other drain-source region coupled to complementary output QB. Transistor T9 has one drain-source region coupled to the high potential VDD and its other drain-source region coupled to output Q. The feedback input Q_DUAL from the other master latch half circuit is coupled to the gates of both T4 and T8. In similar fashion, the complementary feedback input QB_DUAL from the other master latch half circuit is coupled to the gates of both T7 and T9.

The data input portion 16 of each version of the master latch half circuit includes transistors T0, T1, T2, T3, T13, T14 and T15. The clock input is coupled to the gates of both T13 and T14 through an inverter 14. One drain-source region of each of T13 and T14 is coupled to a low voltage, which is at ground potential GND in the preferred embodiment. The second drain source region of T13 is connected to node N1 and the second drain-source region of T14 is connected to node N2. One drain-source region of each of T3 and T0 is coupled to node N1, and the second drain source regions of T3 and T0 are connected to data nodes DATA and DATAB, respectively. Similarly one drain-source region of each of T2 and T1 is coupled to node N2, and the second drain source regions of T2 and T1 are connected to data nodes DATA and DATAB, respectively. An equalization transistor T15 has one drain-source region coupled to data node DATA and its second drain source region to complementary data node DATAB. The gate of T15 is coupled to the high potential VDD. To complete the circuit, complementary data inputs DIN_0 and DINB_0 are coupled to the gates of transistors T0 and T3, respectively, while dual complementary data inputs DIN_1 and DINB_1 are coupled to the gates of T1 and T2, respectively.

In normal operation, the inputs DIN_0, DIN_1 have the same voltage level, while DINB_0, DINB_1 have the same voltage level that is complementary to DIN_0, DIN_1. When CLK is high, Q, QB are precharged to high through transistors T21 through T28, with transistors T16, T17, T19 and T20 for equalization. Q_DUAL, QB_DUAL are similar to Q, QB (see FIG. 1) and are precharged to high to turn on T5, T6 and T4, T7, which will precharge DATAB, DATA to high with a weak transistor T15 for equalization. Either T0, T1 or T1, T3 are turned on by the data inputs, hence nodes of N1, N2 are high since T13, T14 are turned on when CLK is high. When CLK transitions to low from high, T13, T14 are turned on and either T0, T1 or T2, T3 are on depending on whether DIN_0, DIN_1 or DINB_0, DINB_1 are high. Hence, either DATAB or DATA will go low to establish a difference voltage drop across the source and drain of the weak transistor T15, which behaves like a high value resistor at this time, between DATAB and DATA. This will turn on T5 or T6 so that QB or Q and similarly QB_DUAL or Q_DUAL will go low. After the states of QB, QB_DUAL and Q, Q_DUAL are latched up by the cross connections between T5 and T6, further changes from the data inputs will not affect the states of Q and QB when CLK is low.

In this innovative scheme of dual complementary inputs, T0, T1, T13 and T2, T3 T14 (see the dashed line box 16 in FIG. 4) are configured to mitigate the SEU effect for the case when CLK transitions from high to low. For a SEU hit, only 1 of 4 inputs will get upset at one time. In the case where DIN_0, DIN_1 are high and DINB_0, DINB_1 are low, all current flows through T0, T1 and T13, T14 while T2, T3 are turned off when CLK transitions to low. Hence, the node voltage of DATAB will be lower than DATA so that QB goes to low while Q stays at high. If there is a negative hit to pull DIN_0 to low during the CLK high-to-low transition time, T0 is turned off but DATAB goes low because DIN_1 stays at high to hold T1 on. Accordingly, the states of QB and Q stay unchanged. Under the same conditions, if there is a positive hit to pull DINB_0 to high during the clock high-to-low transition time, T3 is turned on. However, the total current running through T0 to T1 is 2 times that of the current running through T3 so that DATAB switches to a lower voltage level than DATA, and accordingly, the states of QB and Q remain unchanged.

Figure 1:
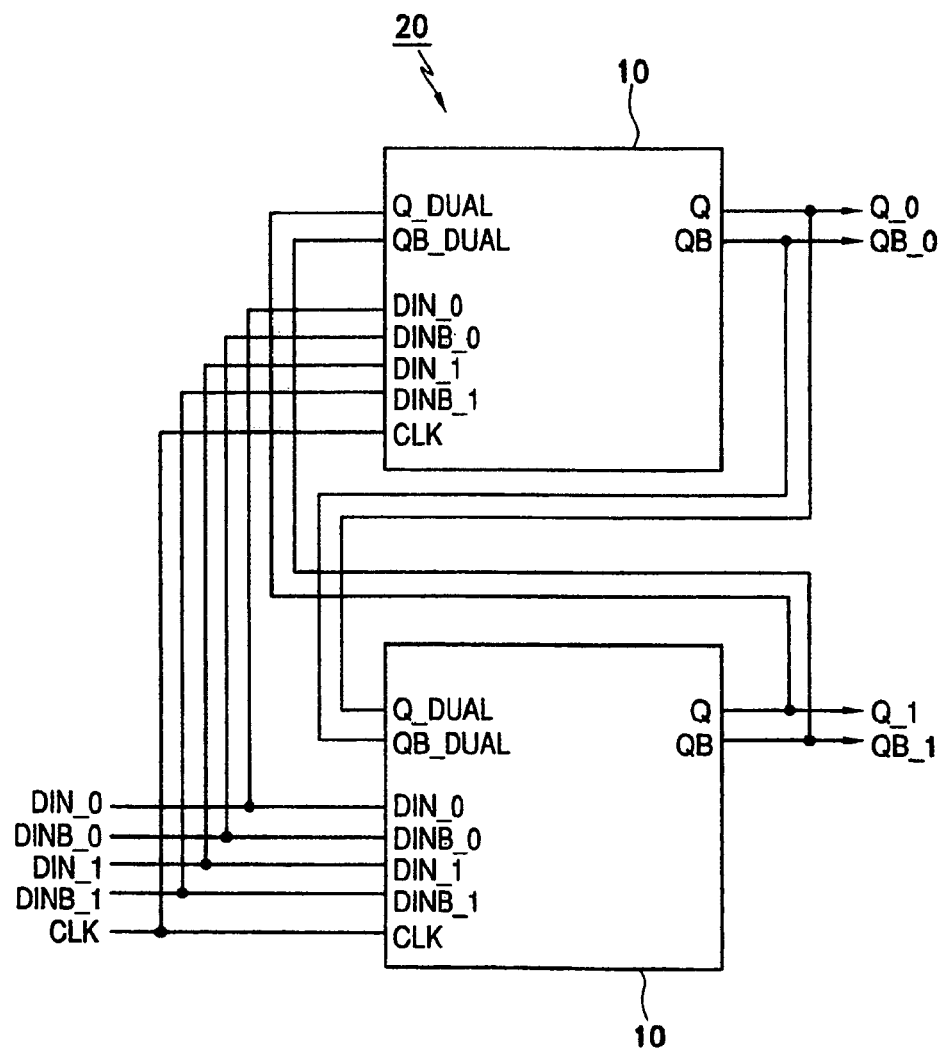
FIG. 1 is a block diagram of a radiation hardened master latch employing two identical half circuits.
Figure 2:
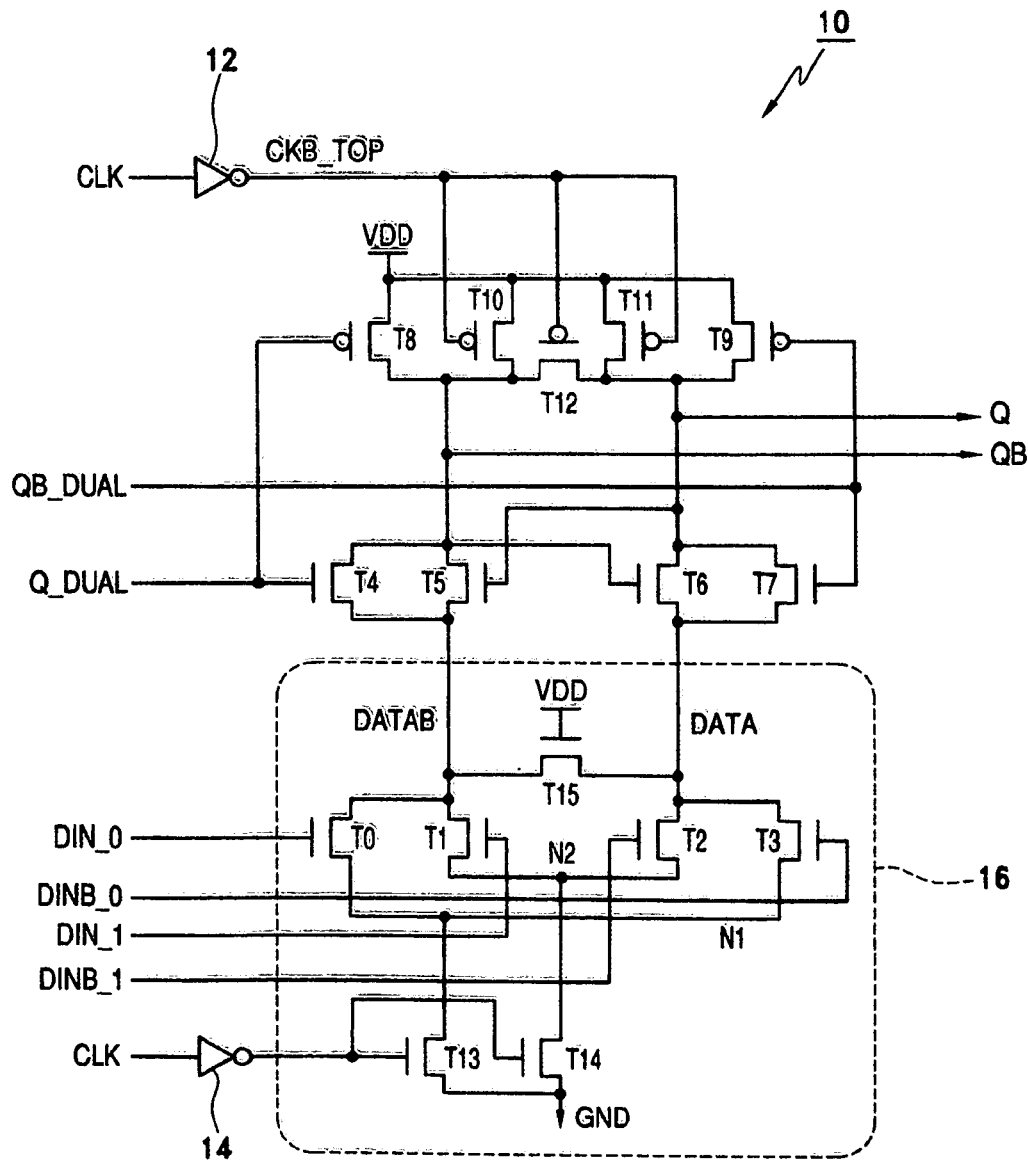
FIG. 2 is a schematic diagram of one of the identical half circuits of the radiation hardened master latch shown in FIG. 1, according to the prior art.
Figure 3:
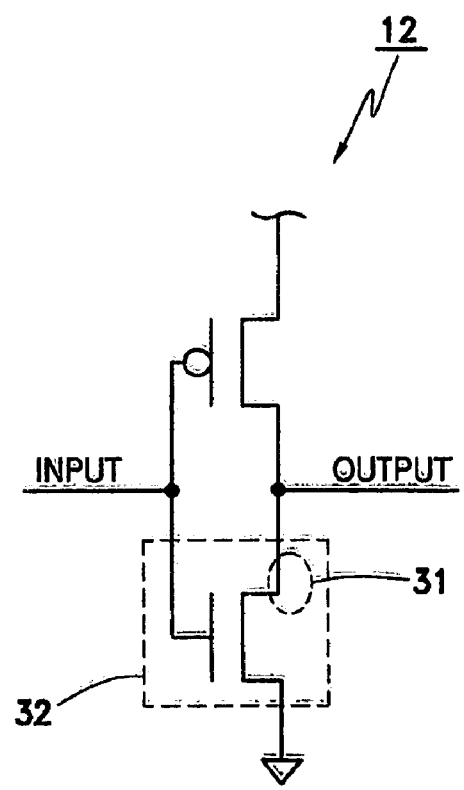
FIG. 3 is a schematic diagram of a typical inverter used in semiconductor logic circuits.

As shown in FIG. 5, a master latch 40 according to the present invention is formed by interconnecting two of the inventive master latch half circuits 9 in the same manner as disclosed in FIG. 1.

Simulation Results

Figure 6A:
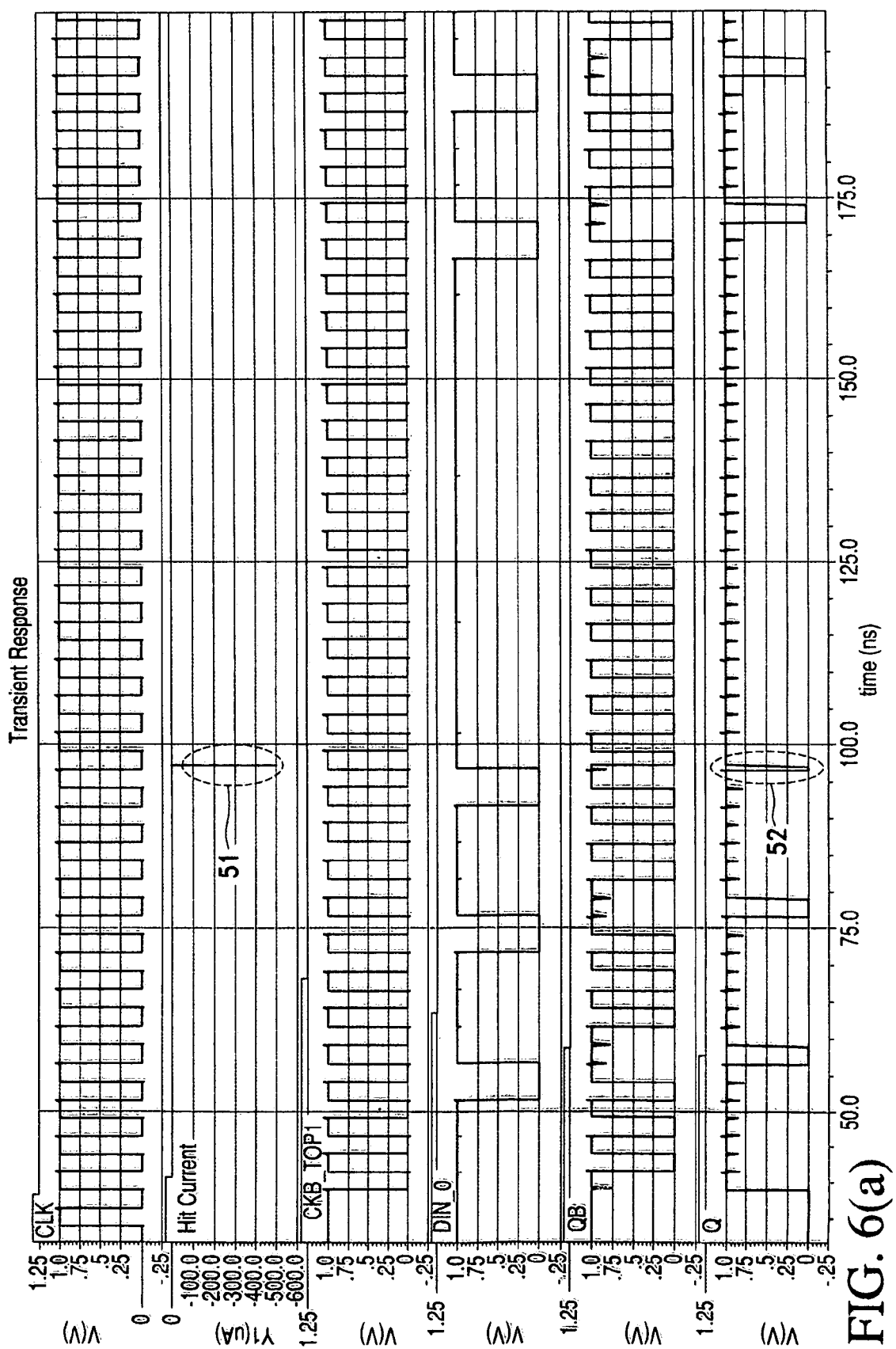
FIG. 6(a) presents the results of a simulation of an SEU hit to the clock node of the master latch half circuit shown in FIG. 2.

FIG. 6(a) is a simulation of the performance of the Mo '008 master latch circuit 20 using the half circuit 10 of FIG. 2 with an SEU hitting the clock input circuit during the evaluate phase, when the output CKB_TOP of the inverter 12 is a logical 1. FIG. 6(a) shows signals at various points in the circuit, including CLK, CKB_TOP, DIN_0, QB and B, in addition to the simulated hit current as a function of time. A hit 51, with a current of 500 uA, 200 ps fall time, and having a total hit energy of 50 fC, is assumed for the purpose of the simulation. As can be seen, the simulated hit causes the master latch to trigger prematurely, producing an anomalous response 52 in the output Q, and a downtime in the master latch of about 75 ns.

Figure 6B:
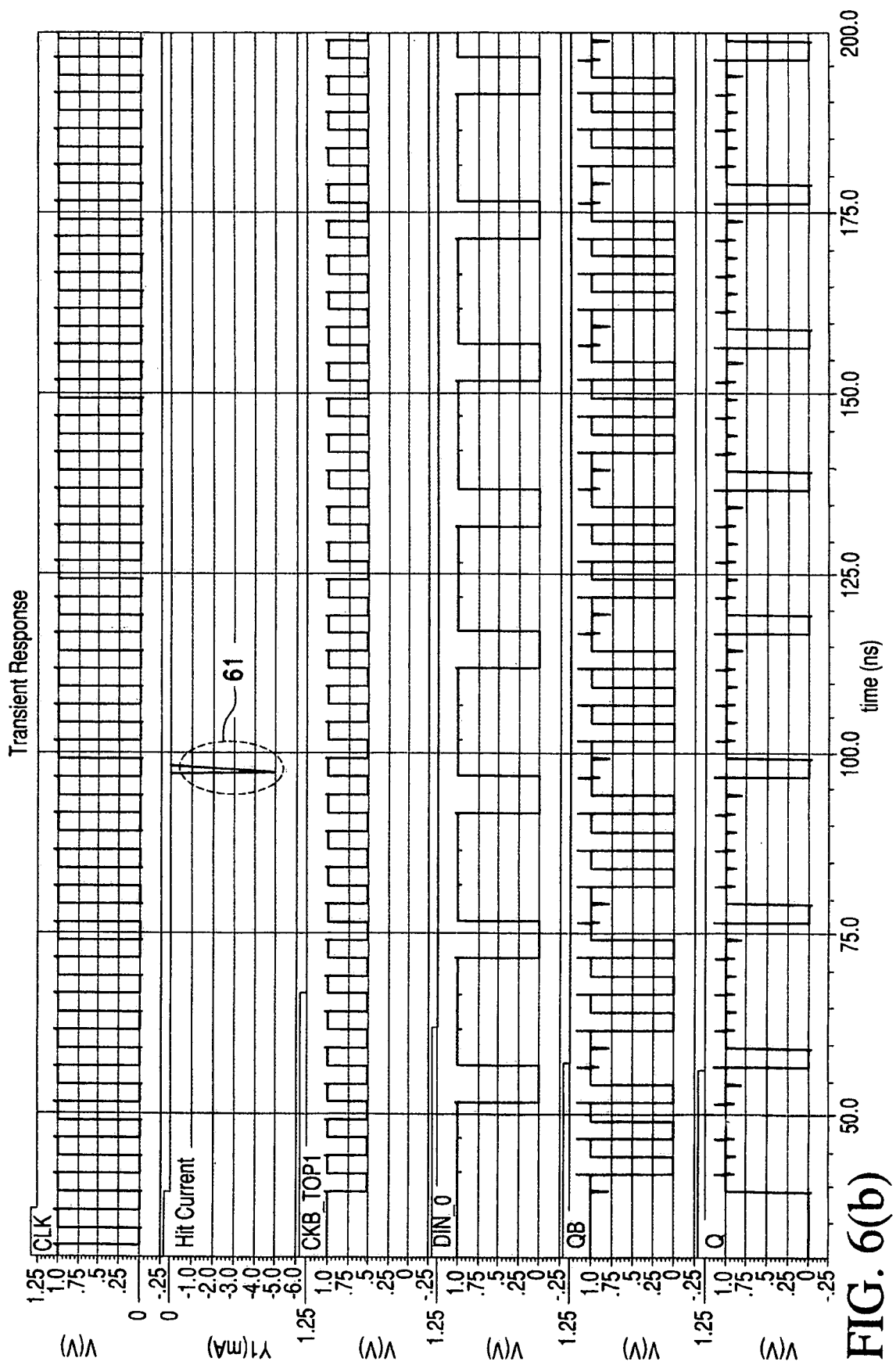
FIG. 6(b) presents the results of a simulation of an SEU hit to a clock node of the master latch half circuit shown in FIG. 4.

FIG. 6(b) is a comparable simulation of the performance of the master latch 40 of the present invention using the half circuit 9 of FIG. 4 with an SEU hitting the clock input circuit during the evaluate phase, at the same time as in FIG. 6(a). A hit 61, with a current of 5 mA, 1 ns fall time, and having a total hit energy of 2.5 pC, is assumed for the purpose of the simulation. This represent a 50 times larger hit energy than the hit energy applied to the clock node of the prior design, and larger than the hit energy that might be expected to be experienced in a space environment. As can be seen in FIG. 6(b), the larger simulated hit has no effect on the output of the master latch, attesting to the robustness of the inventive redundant clock input circuit.

Design Structure

Figure 7:
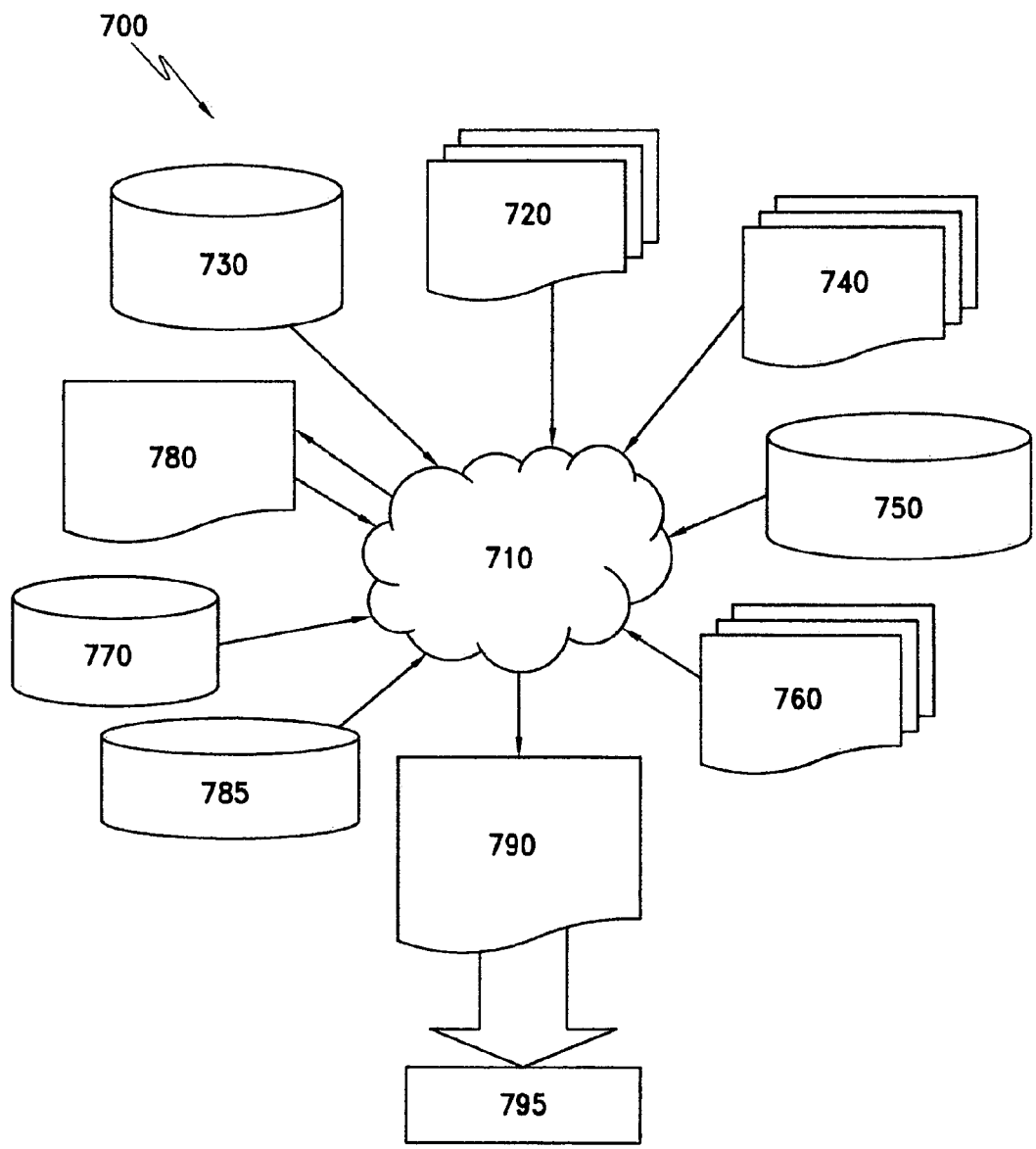
FIG. 7 is a flow diagram of a design process used for semiconductor design, manufacture and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 720 is preferably an input to a design process 710 and may come from an IP provider, a core developer, or other design company or may be generated by the operator of the design flow, or from other sources. Design structure 720 comprises circuit 40 in the form of schematics or HDL, a hardware-description language (e.g., Verilog, VHDL, C, etc.). Design structure 720 may be contained on one or more machine readable media. For example, design structure 720 may be a text file or a graphical representation of circuit 20. Design process 710 preferably synthesizes (or translates) circuit 60 into a netlist 780, where netlist 780 is, for example, a list of wires, transistors, logic gates, control circuits, I/O, models, etc. that describes the connections to other elements and circuits in an integrated circuit design and recorded on at least one of the machine readable media. This may be an iterative process in which netlist 780 is resynthesized one or more times depending on design specifications and parameters for the circuit.

Design process 710 may include using a variety of inputs; for example, inputs from library elements 730 which may house a set of commonly used elements, circuits, and devices, including models, layouts, and symbolic representations, for a given manufacturing technology (e.g., different technology nodes, 32 nm, 45 nm, 90 nm, etc.), design specifications 740, characterization data 750, verification data 760, design rules 770, and test data files 785 (which may include test patterns and other testing information). Design process 710 may further include, for example, standard circuit design processes such as timing analysis, verification, design rule checking, place and route operations, etc. One of ordinary skill in the art of integrated circuit design can appreciate the extent of possible electronic design automation tools and applications used in design process 710 without deviating from the scope and spirit of the invention. The design structure of the invention is not limited to any specific design flow.

Design process 710 preferably translates an embodiment of the invention as shown in FIGS. 4 and 5 along with any additional integrated circuit design or data (if applicable), into a second design structure 790. Design structure 790 resides on a storage medium in a data format used for the exchange of layout data of integrated circuits (e.g. information stored in a GDSII (GDS2), GL1, OASIS, or any other suitable format for storing such design structures). Design structure 790 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 4 and 5. Design structure 790 may then proceed to a stage 795 where, for example, design structure 790: proceeds to tape-out, is released to manufacturing, is released to a mask house, is sent to another design house or back to the customer, etc.

Conclusion

The above-described designs provide the essential techniques for radiation hardening the clock inputs of logic circuits required to operate at GHz frequencies. The obvious drawbacks of these techniques is larger circuit area and higher power consumption.

It should be understood that the invention is not necessarily limited to the specific process, arrangement, materials and components shown and described above, but may be susceptible to numerous variations within the scope of the invention. For example, although the above-described exemplary aspects of the invention are believed to be particularly well suited for latch circuits typically used in programmable phase frequency dividers, it is contemplated that the concepts of the presently disclosed logic circuits can be used in other RADHARD logic systems requiring the mitigation of SEU events. Moreover, the proposed circuit schemes, while presented in the context of existing CMOS technologies; are device independent and equally applicable to other current and future logic technologies.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A radiation hardened master latch comprising:
a first master latch half circuit; and
a second master latch half circuit identical to and interconnected with the first master latch half circuit,
wherein
each of the first and second master latch half circuits has a clock input,
each of the first and second master latch half circuits includes a clock input circuit in which the clock input is coupled to a plurality of sub-clock nodes,
the clock input circuit is configured such that the operation of the master latch half circuit is immune to a single upset event affecting at most one of the plurality sub-clock nodes, each of the first and second master latch half circuits has, in addition to the clock input, first and second data inputs, first and second complementary data inputs, a feedback input, a complementary feedback input, a data output, and a complementary data output, the respective clock inputs of the first and second master latch half circuits are connected together in parallel, the respective first and second data inputs and first and second complementary data inputs of the first and second master latch half circuits are connected together in parallel, the data output and the complementary data output of the first master latch half circuit are connected respectively to the feedback input and the complementary feedback input of the second master latch half circuit, and the data output and the complementary data output of the second master latch half circuit are connected respectively to the feedback input and the complementary feedback input of the first master latch half circuit.

2. The master latch of claim 1, wherein the first and second data inputs and the first and second complementary data inputs to the master latch, respectively, have nominally the same input voltage levels in the absence of single event upsets.

3. The master latch of claim 1, wherein operation of the master latch is immune to a single event upset affecting at most one of the four data inputs to the master latch.

4. The master latch of claim 1, wherein the plurality of sub-clock nodes is four in number.

5. The master latch of claim 4, wherein the clock input circuit of each of the master latch half circuits is comprised of:
first, second, third and fourth inverters with inputs coupled in common to the clock input of the master latch half circuit, and outputs coupled respectively to the first, second, third and fourth sub-clock nodes;
first and second pre-charging transistors connected in series, the first pre-charging transistor having one drain-source region coupled to a high voltage source and the other source-drain region coupled to one drain-source region of the second pre-charging transistor, and the other drain-source region of the second pre-charging transistor coupled to the data output;
third and fourth pre-charging transistors connected in series, the third pre-charging transistor having one drain-source region coupled to the high voltage source and the other source-drain region coupled to one drain-source region of the fourth pre-charging transistor, and the other drain-source region of the fourth pre-charging transistor coupled to the data output;
fifth and sixth pre-charging transistors connected in series, the fifth pre-charging transistor having one drain-source region coupled to the high voltage source and the other source-drain region coupled to one drain-source region of the sixth pre-charging transistor, and the other drain-source region of the sixth pre-charging transistor coupled to the complementary data output;
seventh and eighth pre-charging transistors connected in series, the seventh pre-charging transistor having one drain-source region coupled to the high voltage source and the other source-drain region coupled to one drain-source region of the eighth pre-charging transistor, and the other drain-source region of the eighth pre-charging transistor coupled to the complementary data output;
first and second equalization transistors connected in series, the first equalization transistor having one drain-source region coupled to the complementary data output and the other source-drain region coupled to one drain-source region of the second equalization transistor, and the other drain-source region of the second equalization coupled to the data output;
third and fourth equalization transistors connected in series, the third equalization transistor having one drain-source region coupled to the complementary data output and the other source-drain region coupled to one drain-source region of the fourth equalization transistor, and the other drain-source region of the fourth equalization coupled to the data output,
wherein
the first sub-clock node is coupled to the gates of the first and fifth pre-charging transistors and to the gate of the fourth equalization transistor,
the second sub-clock node is coupled to the gates of the second and sixth pre-charging transistors and to the gate of the third equalization transistor,
the third sub-clock node is coupled to the gates of the fourth and eighth pre-charging transistors and to the gate of the first equalization transistor, and
the fourth sub-clock node is coupled to the gates of the third and seventh pre-charging transistors and to the gate of the second equalization transistor.

6. The master latch of claim 5, wherein the clock input circuit is implemented in CMOS technology.

7. The master latch of claim 5, wherein each of the master latch half circuits is further comprised of:

ninth and tenth pre-charging transistors, the ninth pre-charging transistor having one drain-source region coupled to the high voltage source and the other source-drain region coupled to the data output, the tenth pre-charging transistor having one drain-source region coupled to the high voltage source and the other drain-source region coupled to the complementary data output;

first and second latch transistors each having one drain-source region coupled to the data output and the other source-drain region coupled to a first data node;

third and fourth latch transistors each having one drain-source region coupled to the complementary data output and the other source-drain region coupled to a second data node, the gates of the third and second latch transistors being cross coupled to the data output and the complementary data output, respectively, the gates of both the fourth latch transistor and the tenth pre-charging transistor being coupled to the feedback input, and the gates of both the first latch transistor and the ninth pre-charging transistor being coupled to the complementary feedback input;

a first clocking transistor having one drain-source region coupled to ground potential, the other drain-source region coupled to a first data clocking node and the gate coupled to the clock input through a fifth inverter;

a second clocking transistor having one drain-source region coupled to ground potential, the other drain-source region coupled to a second data clocking node and the gate coupled to the gate of the first clocking transistor;

a first data input transistor having one drain-source region coupled to the first data node, the other drain-source region coupled to the first data clocking node and the gate coupled to the first complementary data input;

a second data input transistor having one drain-source region coupled to the first data node, the other drain-source region coupled to the second data clocking node and the gate coupled to the second complementary data input;

a third data input transistor having one drain-source region coupled to the second data node, the other drain-source region coupled to the second data clocking node and the gate coupled to the second data input;

a fourth data input transistor having one drain-source region coupled to the second data node, the other drain-source region coupled to the first data clocking node and the gate coupled to the first data input;

a data node equalization transistor having one drain-source region coupled to the first data node, the other drain-source region coupled to the second data node and the gate coupled to the high potential.

8. The master latch of claim 7, wherein the master latch half circuits are implemented in CMOS technology.

* * * * *